United States Patent [19]

Mouchot et al.

[11] Patent Number: 5,635,835
[45] Date of Patent: Jun. 3, 1997

[54] SELF BIASED MULTILAYER MAGNETORESISTANCE SENSOR

[75] Inventors: Jean Mouchot, Grenoble; Bernard Dieny, Seyssinet, both of France

[73] Assignee: Commissariat a l'Energie Atomique, France

[21] Appl. No.: 499,949

[22] Filed: Jul. 10, 1995

[30] Foreign Application Priority Data

Jul. 21, 1994 [FR] France ................. 94 09038

[51] Int. Cl.$^6$ ............ G01R 33/09; H01L 33/08; G11B 5/30
[52] U.S. Cl. ............ 324/252; 338/32 R; 360/113
[58] Field of Search ............ 324/207.21, 207.12, 324/252, 225, 207.24, 207.25; 338/32 R; 360/113

[56] References Cited

U.S. PATENT DOCUMENTS

| | | | |
|---|---|---|---|
| 4,713,708 | 12/1987 | Krounbi et al. | |
| 4,816,948 | 3/1989 | Kamo et al. | |
| 5,206,590 | 4/1993 | Dieny et al. | 324/252 |
| 5,422,571 | 6/1995 | Gurney et al. | 324/252 |
| 5,452,163 | 9/1995 | Coffey et al. | 360/113 |
| 5,461,527 | 10/1995 | Akiyama et al. | 360/113 |
| 5,465,185 | 11/1995 | Heim et al. | 324/252 |
| 5,508,867 | 4/1996 | Cain et al. | 360/113 |

FOREIGN PATENT DOCUMENTS

| | | |
|---|---|---|
| 0529959 | 3/1993 | European Pat. Off. |
| 42 43 357 | 6/1994 | Germany |

OTHER PUBLICATIONS

Patent Abstracts of Japan, vol. 18, No. 35 (E-1494), Jan. 19, 1994, JP-A-5 267 747, Oct. 15, 1993.
Patent Abstracts of Japan, vol. 15, No. 106 (E-1044), Mar. 13, 1991, JP-A-2 312 287, Dec. 27, 1990.
Patent Abstracts of Japan, vol. 16, No. 189 (P-1348), May 8, 1992, JP-A-4 024 575, Jan. 28, 1992.

*Primary Examiner*—Sandra L. O'Shea
*Assistant Examiner*—Roger Phillips
*Attorney, Agent, or Firm*—Oblon, Spivak, McClelland, Maier & Neustadt, P.C.

[57] ABSTRACT

A self-bias sensor including a current source, a resistance measuring device and a sensor element sensitive to a magnetic field to be measured. The sensor element receives from the current source a current which creates a self-biasing field. The sensor element includes a first ferromagnetic layer having a magnetization direction which is sensitive to the magnetic field and when not subject to the magnetic field, and is oriented by the self-biasing field in a direction perpendicular to a longitudinal direction of the sensor element; a second ferromagnetic layer disposed between a first and second conductive layer, where the second ferromagnetic layer has a magnetization which is blocked and directed in the longitudinal direction; and a third ferromagnetic layer which is disposed on the second conductive layer and has a magnetization direction which is sensitive to the magnetic field and, when not subject to the magnetic field, is oriented by the self-biasing field in a second direction perpendicular to the longitudinal direction and substantially of an opposite sense to the magnetization of the first ferromagnetic layer.

17 Claims, 3 Drawing Sheets

SELF BIASED MULTILAYER MAGNETORESISTANCE SENSOR

TECHNICAL FIELD

The present invention relates to a self biased multi-layer magnetoresistance sensor. It is particularly applicable to the production of reading heads for magnetic recording, magnetoresistive sensors for systems of the coder type and magnetoresistive sensors for measuring currents.

PRIOR ART

A magnetoresistant element is an element undergoing a resistance variation as a function of the magnetic field applied thereto. In order to measure said resistance either a current is made to flow in the magnetoresistance and measurement takes place of the voltage at the terminals of the element, or a potential difference is imposed at the terminals of the element and the intensity variation of the current is measured.

Magnetoresistive sensors are known for which the direction of the field to be measured is directed perpendicular to the longitudinal axis of the magnetoresistant element and others where the field is parallel to said longitudinal axis. The present invention relates to the second case.

Certain magnetoresistances are constituted by a single material and are said to be "monolithic". Others are constituted by a stack of magnetic layers separated by non-magnetic layers and they are said to be "multilayer". In certain multilayer magnetoresistances, it is possible to change the relative orientation of the magnetizations in successive magnetic layers. There is then a resistance variation as a function of whether the magnetic layers are oriented antiparallel or parallel to one another.

In the vast majority of known systems, the electrical resistance is at a maximum for an antiparallel alignment configuration and at a minimum for a parallel alignment configuration.

As a function of the thickness and nature of the magnetic and non-magnetic layers, it is possible to optimize the magnetoresistive effect.

It is also advantageous in certain cases to polarize the magnetoresistive element by means of a static magnetic field, so that the electrical response of said magnetoresistive element becomes linear as a function of the field to be measured. The magnetic polarization field is generally applied in uniform manner in the plane of the magnetoresistive element.

Thus, U.S. Pat. No. 4,949,039 describes a magnetoresistive effect obtained with magnetic layers separated by thin layers of non-magnetic materials. In one of the structures described, two layers of soft ferromagnetic materials are disengaged from one another by a non-magnetic layer and one of the ferromagnetic layers is trapped by exchange anisotropy (exchange coupling with a fourth layer of an anti-ferromagnetic material, e.g. FeMn). This document specifies that the materials used must be such that a scattering dependent on the spin must occur at the interface between the magnetic material and the non-magnetic material.

The article by H. Yamamoto and T. Shinjo published in IEEE Translation Journal on Magnetics in Japan, vol.7, no. 9, September 1992 entitled "Magnetoresistance of Multilayers", pp. 674–684, describes metallic multilayer magnetic structures. They are essentially constituted by magnetic metals based on iron, nickel, cobalt or any of the alloys formed from these three elements and non-ferromagnetic transition metals or noble metals such as e.g. copper, chromium, silver, gold, molybdenum and ruthenium.

Although satisfactory in certain respects, all these means suffer from the disadvantage of requiring polarization means to obtain a linear response. The object of the present invention is to obviate this disadvantage.

DESCRIPTION OF THE INVENTION

To this end, the invention proposes a sensor in which the element sensitive to the magnetic field is polarized by the current flowing in the magnetoresistance. The response of the sensor is consequently automatically linear without it being necessary to add means for creating a polarization field.

More specifically, the present invention relates to a self biased multilayer magnetoresistant sensor comprising, in known manner:

- an element sensitive to the magnetic field comprising a stack of alternately magnetic and non-magnetic layers, said element having a longitudinal direction oriented parallel to the magnetic field to be measured,
- means for passing an electric current through the element in the longitudinal direction,
- means for measuring the resistance of the element, characterized in that the element sensitive to the magnetic field has a stack of at least one first ferromagnetic layer, surrounded by a second and a third ferromagnetic layers separated from the first layer by a first and a second conductive, non-magnetic layers, the first ferromagnetic layer having a magnetization which is blocked and directed in the longitudinal direction, the second and third layers having, in the absence of a magnetic field to be measured when the electric current traverses the sensitive element, magnetizations which are substantially perpendicular to the longitudinal direction, the magnetization in the second layer substantially having the opposite sense to the magnetization in the third layer.

In an advantageous variant, the stack has two other ferromagnetic layers with a blocked longitudinal magnetization, said other layers associated with conductive, non-magnetic layers surrounding the aforementioned stack.

Preferably, the ferromagnetic layer or layer with longitudinal magnetization is an alloy based on iron and cobalt, optionally with a small percentage of anisotropic rare earths such as e.g. Nd, Sm or Tb.

With respect to the second and third ferromagnetic layers with reverse magnetization directions perpendicular to the longitudinal direction, they are advantageously of a soft ferromagnetic alloy of transition metals such as an alloy of iron, nickel or cobalt and e.g. of permalloy (Fe20Ni80). The thickness of said layers can be e.g. between 1 and 10 nm.

On either side of the stack, the element can have an alternation of ferromagnetic layers with a longitudinally blocked magnetization and ferromagnetic layers of perpendicular at magnetization like the second and third layers, said different layers being separated by conductive, non-magnetic layers.

The conductive, non-magnetic layers are e.g. of copper, silver or gold. The thickness of these non-magnetic layers is sufficient (e.g. between 1 and 10 nm) for the ferromagnetic layers with opposite magnetizations to be considered as magnetically isolated (free). The blocking of the magnetization of the ferromagnetic layer or layers with longitudinal magnetization can be obtained either by choosing a high coercivity material, or by associating with each ferromagnetic layer a layer of a hard magnetic material or an antiferromagnetic material able to introduce an exchange anisotropy. The term high coercivity material is understood to mean a material, whose coercive field exceeds the field to be measured.

DETAILED DESCRIPTION OF EMBODIMENTS

Figure 1:
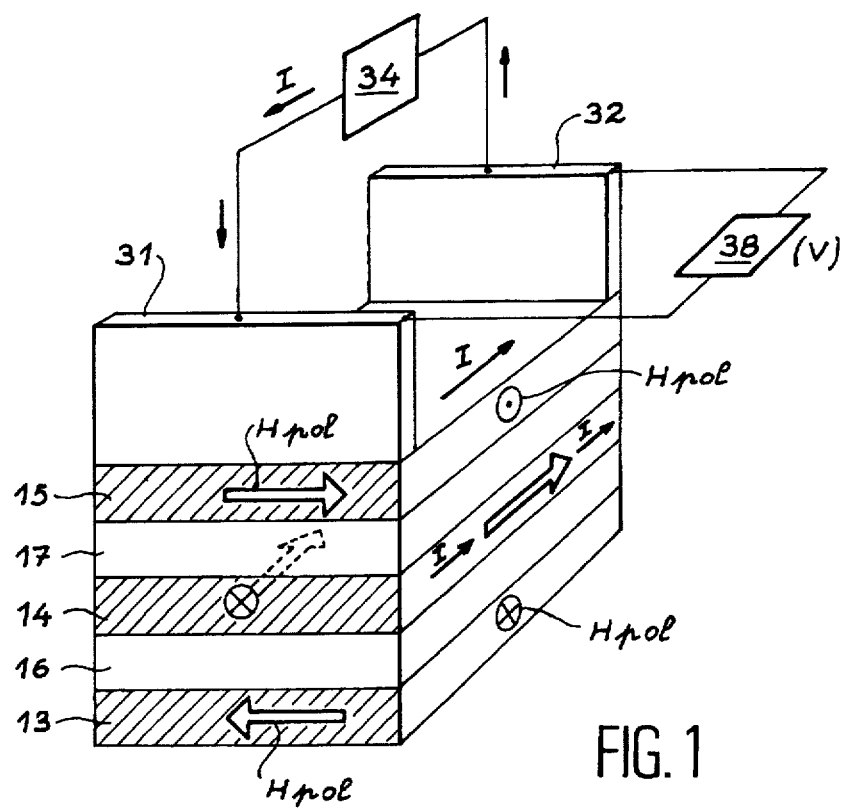
FIG. 1 is a diagrammatic view of a sensor according to the invention.

FIG. 1 is a perspective view of a sensor according to the invention with a first ferromagnetic layer 14 having a blocked longitudinal magnetization (diagrammatically illustrated by an arrow directed perpendicular to the plane of the drawing), a second ferromagnetic layer 13 with a magnetization parallel to the plane of the drawing and directed to the left, a third ferromagnetic layer 15 with a magnetization still parallel to the plane of the drawing, but directed to the right. These three layers 13, 14 and 15 are separated from one another by a first and a second non-magnetic layers, respectively 16 and 17. These electricity conducting layers are made from metal.

Two connections 31, 32 are located at each end of the stack and the assembly is connected to a current generator 34 making a current I flow in the stack.

An apparatus 38 of the voltmeter type measures the voltage at the terminals of the stack and said voltage gives the value of the resistance of the stack if the current I is kept constant.

The circulation of the current I produces a magnetic field, whose field lines are approximately straight lines perpendicular to the current vector I and parallel to the interfaces of the layers. The intensity of this current is given by Amperes law, which states that the flow of the field along a closed contour is equal to the current passing through the surface defined by said contour. Thus, it is easily possible to demonstrate that this self-biasing field created by the current is zero in the median plane of the stack and varies linearly on either side of said plane.

For example, with 5 nm thick layers 12, 14 and 15 and 2.5 nm thick layers 16 and 17, the field produced by a current of $10^7$ A/cm$^2$ is 1 kA/m at a distance of 10 nm from the central plane of the stack. This field constitutes a polarization field intrinsic to the sensitive element.

Figure 2:
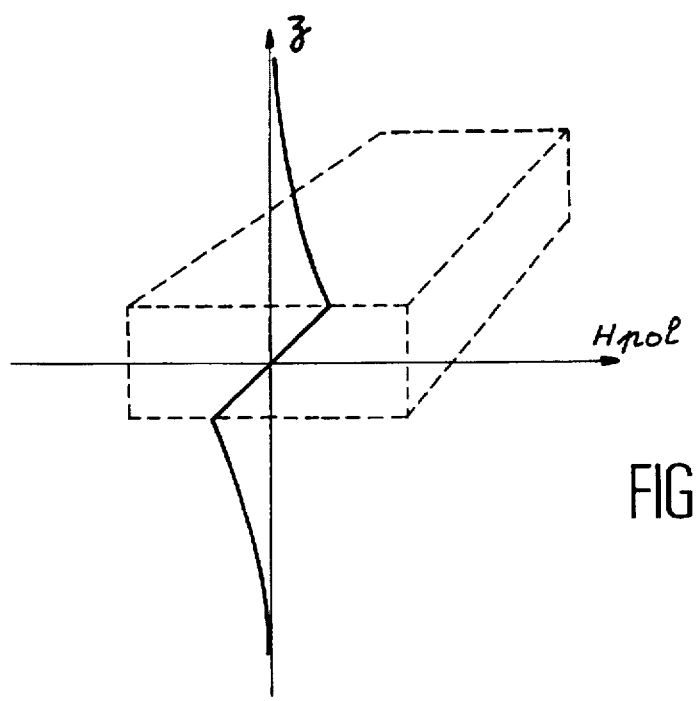
FIG. 2 shows the variation of the magnetic polarization field as a function of the distance from the centre of the element.

FIG. 2 gives the intensity variation of said field Hpol (plotted on the abscissa) as a function of the distance z from the median plane of the structure (plotted on the ordinate). The field is zero in the median plane and increases on either side thereof, linearly when within the stack, but outside the same the field decreases to cancel out at infinity.

Under the effect of the polarization field Hpol, the magnetizations of the layers 13 and 15 are oriented substantially perpendicularly to the magnetization direction of the blocked ferromagnetic layer 14. Moreover, the magnetizations of the layers 13 and 15 are antiparallel.

The application of a magnetic field to be measured tends to make the magnetizations of the layers 13 and 15 turn in the direction of the field applied, which changes the relative orientation of the magnetizations of the layers 14 and 15 and consequently modifies the resistivity ρ of the structure.

Figure 3:
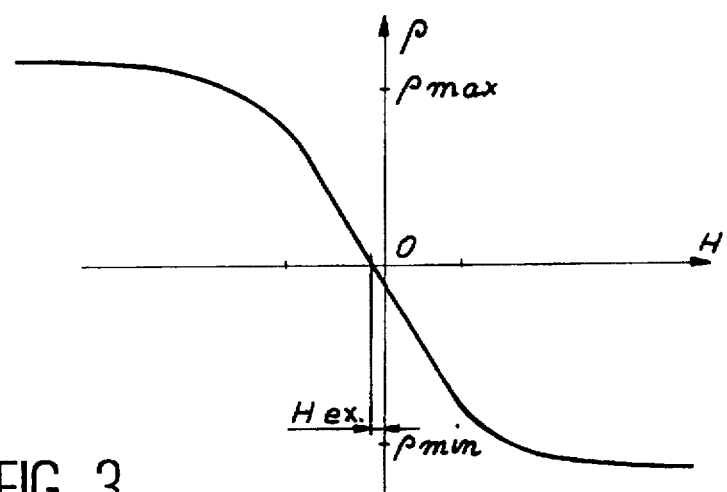
FIG. 3 shows the variation of the resistivity as a function of the longitudinal magnetic field applied.

FIG. 3 shows an example of the variation of the resistivity ρ (plotted on the ordinate) as a function of the magnetic field applied H (plotted on the abscissa). It can be seen that this variation is linear in a certain field range.

The curve ρ(H) may not pass through the origin and can be displaced by a field Hex, as is the case in FIG. 3. This displacement corresponds either to a possible ferromagnetic coupling or antiferromagnetic coupling residue between the layers, or to form anisotropy effects.

Figure 4:
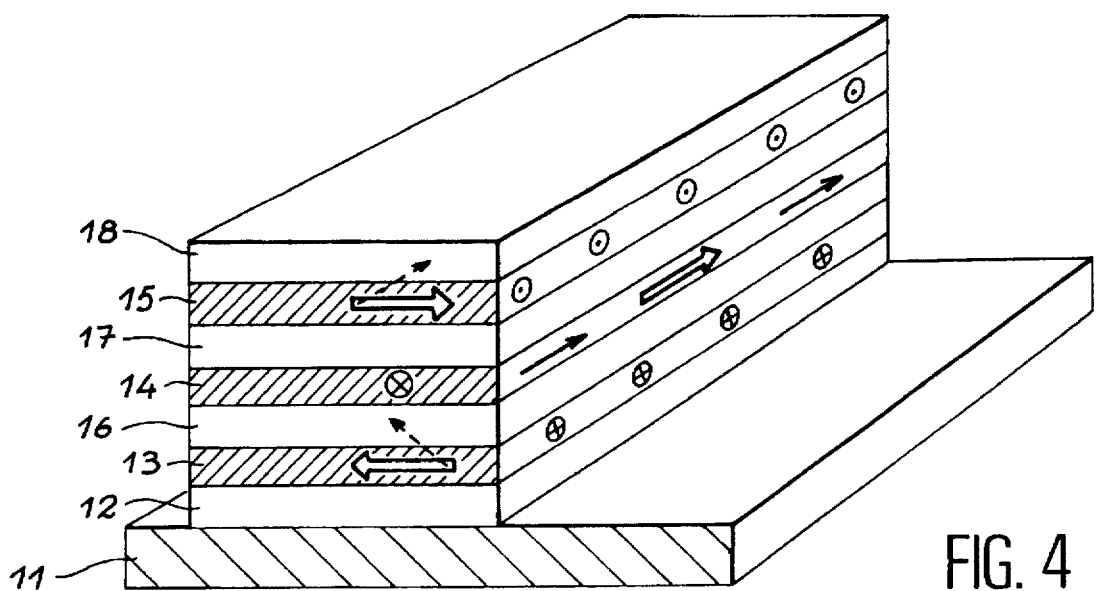
FIG. 4 illustrates a first embodiment of the element sensitive to the magnetic field.
Figure 5:
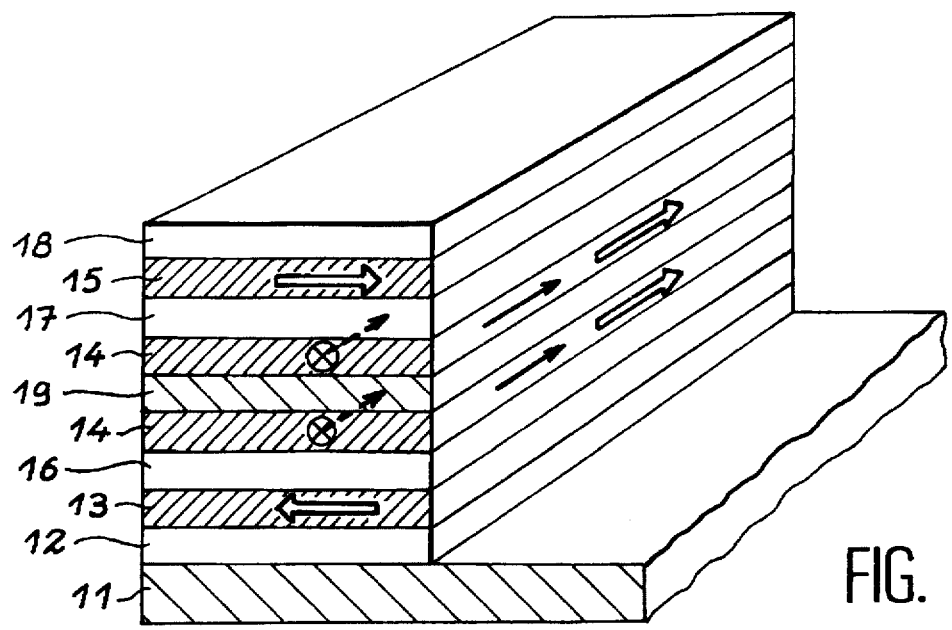
FIG. 5 illustrates a second embodiment of the element sensitive to the magnetic field.
Figure 6:
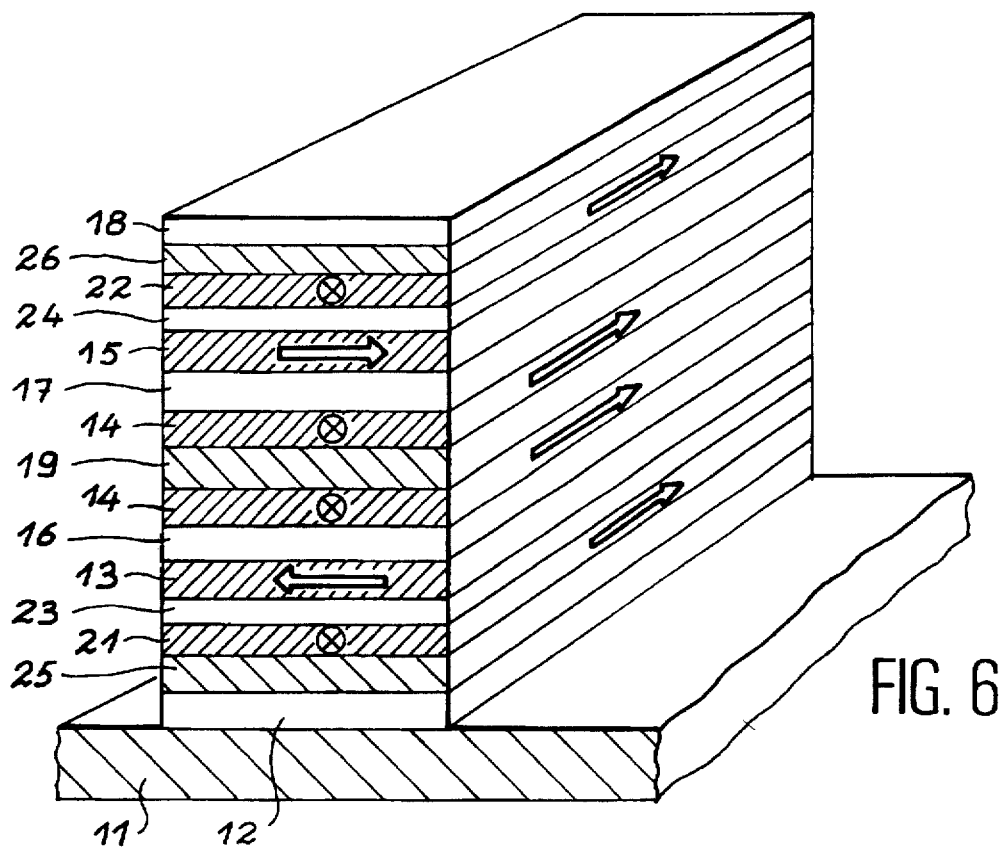
FIG. 6 illustrates a third embodiment of said element.

FIGS. 4, 5 and 6 illustrate three embodiments of a sensor according to the invention. In these drawings, the electrical connections, the current supply source and the resistance measuring means are not shown.

FIG. 4 shows a substrate 11, a buffer layer 12, e.g. of tantalum, and layers 13, 14, 15, 16, 17, which are shown in FIG. 1. In addition, a tantalum or TiW protective layer 18 is deposited on the assembly.

In the variant of FIG. 5, the high coercivity, central ferromagnetic layer is constituted by a soft magnetic layer 14, e.g. of permalloy, said layer having its magnetization blocked either by exchange anisotropy with a type MnFe, NiO or TbCo antiferromagnetic layer, or by a direct coupling with a hard material (such as an alloy based on NdCo, SmCo, NdFeB, etc.), said supplementary layer being designated 19. In FIG. 5, the layer 14 is subdivided into two portions between which is placed the antiferromagnetic layer or the hard magnetic layer 19. All the other layers 12 to 18 and the substrate 11 are also provided.

In the case of FIG. 6, the aim is to increase the sought effect, namely the resistivity variation. The structure described relative to FIG. 5 is retained but is filled out at the top and bottom. Fourth and fifth ferromagnetic layers 21 and 22 are deposited and are e.g. based on iron, nickel or cobalt (and are advantageously cobalt-rich). The magnetization is blocked in the direction of the field to be measured. This blocking can be ensured by using high coercivity materials, as in FIG. 1 (the coercive field greatly exceeding the field to be measured) or by exchange anisotropy with layers 25 and 26, as in FIG. 5, said layers being of an antiferromagnetic material, e.g. FeMn. The layers 21 and 22 are separated from the magnetic layers 13, 15 by two non-magnetic material layers 23, 24, e.g. of silver and having a thickness such that there is little or no magnetic coupling between the layers 15 and 22 or 13 and 21.

The structure can also be covered by a protective layer 18 of e.g. Ta or TiW.

In this example, the layers 21, 14 and 22 are oriented in parallel. Only the ferromagnetic layers 13 and 15 are free to turn in the absence of a current to be measured. In the presence of a current, but without a field applied, the layers 13 and 15 are oriented substantially at 90° of the magnetization direction of the layers 14, 21 and 22. The magnetic field to be measured disorientates the magnetization of the layers 13 and 15, consequently modifying the resistivity of the structure.

As described in EP 529 959, it can be advantageous to deposit at each interface between the non-magnetic material layers and the ferromagnetic material layers 13, 14 and 15 or at certain of these interfaces, an ultra-thin layer of a cobalt-rich material (e.g. $Co_{90}Fe_{10}$) in order to increase the sought magnetoresistive effect. This variant can be applied in all cases and more particularly in those of FIGS. 1, 4 and 5.

We claim:

1. A self-biased sensor comprising:

a current source which produces a current;

a sensor element having a longitudinal direction and a resistance that is sensitive to a magnetic field to be measured, said sensor element connected to said current source and receiving the current which passes through the sensor element to create a self-biasing field, said sensor element comprising, a first ferromagnetic layer having a magnetization direction which is sensitive to the magnetic field and, when not subject to the magnetic field, is oriented by the self-biasing field in a first direction perpendicular to the longitudinal direction, a first conductive, non-magnetic layer disposed on said first ferromagnetic layer, a second ferromagnetic layer disposed on said first conductive, non-magnetic layer and having a magnetization which is blocked and directed in the longitudinal direction, a second conductive, non-magnetic layer disposed on said second ferromagnetic layer, and a third ferromagnetic layer disposed on said second conductive, non-magnetic layer having a magnetization direction which is sensitive to the magnetic field and, when not subject to the magnetic field, is oriented by the self-biasing field in a second direction perpendicular to the longitudinal direction and substantially of an opposite sense to the magnetization of the first ferromagnetic layer; and a resistance measuring device which measures a resistance value of the sensor element that corresponds to the magnetic field to be measured.

2. The self-biased sensor of claim 1, wherein said sensor element further comprises:

a fourth ferromagnetic layer having a magnetization which is blocked and directed in the longitudinal direction, said fourth ferromagnetic layer disposed under said first ferromagnetic layer;

a third conductive, non-magnetic layer disposed between said fourth ferromagnetic layer and the first ferromagnetic layer;

a fourth conductive, non-magnetic layer disposed on said third ferromagnetic layer; and a fifth ferromagnetic layer disposed on said fourth conductive, non-magnetic layer having a magnetization which is blocked and directed in the longitudinal direction.

3. The self-bias sensor of claim 1, wherein said second ferromagnetic layer comprises an alloy based on iron and cobalt.

4. The self-bias sensor of claim 3, wherein the alloy comprises a low percentage of anisotropic rare earth materials.

5. The self-bias sensor of claim 1, wherein the first ferromagnetic layer and the third ferromagnetic layer comprise a soft transition metal ferromagnetic alloy.

6. The self-bias sensor of claim 1, wherein the first and the second conductive, non-magnetic layers comprise at least one of a Cu, an Ag, and an Au material.

7. The self-bias sensor of claim 1, wherein the second ferromagnetic layer has a coercive field which is greater in magnitude than the magnetic field to be measured.

8. The self-bias sensor of claim 1, wherein the sensor element further comprises:

said second ferromagnetic layer comprising a soft magnetic material;

an antiferromagnetic layer in contact with the second ferromagnetic layer thereby introducing an exchange amisotropy.

9. The self-bias sensor of claim 8, wherein the antiferromagnetic material comprises at least one of a MnFe, NiO, TbCo and DyCo material.

10. The self-bias sensor of claim 1, wherein the second ferromagnetic layer comprises a soft magnetic material and is in contact with a hard magnetic material layer.

11. The self-bias sensor of claim 10, wherein the hard magnetic material comprises at least one of a NdCo, a SmCo, and a NdFeB material.

12. The self-bias sensor of claim 9, wherein the second ferromagnetic layer comprises a first ferromagnetic portion and a second ferromagnetic portion, and said antiferromagnetic material is disposed between the first and the second ferromagnetic portions.

13. The self-bias sensor of claim 10, wherein the second ferromagnetic layer comprises a first ferromagnetic portion and a second ferromagnetic portion, and the hard material is disposed between said first and the second ferromagnetic portions.

14. The self-bias sensor of claim 1, wherein said sensor element further comprises:

a first cobalt-rich, magnetic layer disposed between said second ferromagnetic layer and said first conductive, non-magnetic layer; and a second cobalt-rich, magnetic layer disposed between said second ferromagnetic layer and said second conductive, non-magnetic layer.

15. The self-bias sensor of claim 1, wherein said sensor element further comprises a protective layer disposed on said third ferromagnetic layer.

16. The self-bias sensor of claim 1, further comprising a substrate on which said sensor element is disposed.

17. The self-bias sensor of claim 16, further comprising a buffer layer disposed between said substrate and said sensor element.

\* \* \* \* \*

UNITED STATES PATENT AND TRADEMARK OFFICE
CERTIFICATE OF CORRECTION

PATENT NO. : 5,635,835
DATED : June 3, 1997
INVENTOR(S) : Jean MOUCHOT, et al.

It is certified that error appears in the above-indentified patent and that said Letters Patent is hereby corrected as shown below:

On the title page, item [73], the assignee's address should read:

--Paris, France--

Signed and Sealed this

Second Day of September, 1997

BRUCE LEHMAN

*Attest:*

*Attesting Officer*   Commissioner of Patents and Trademarks